United States Patent [19]

Kim et al.

[11] Patent Number: 5,973,521
[45] Date of Patent: Oct. 26, 1999

[54] SEMICONDUCTOR DEVICE FOR AUTOMATICALLY DETECTING EXTERNAL INTERFACE VOLTAGE

[75] Inventors: Jung Pill Kim; Joon Ho Kim, both of Ichon, Rep. of Korea

[73] Assignee: Hyundai Electronics Industries Co., Ltd., Rep. of Korea

[21] Appl. No.: 08/960,228

[22] Filed: Oct. 29, 1997

[30] Foreign Application Priority Data

Nov. 8, 1996 [KR] Rep. of Korea ...................... 96-52879

[51] Int. Cl.⁶ ............................................. H03B 1/00
[52] U.S. Cl. .............................. 327/112; 327/77; 326/87
[58] Field of Search ................................ 326/62, 63, 80, 326/81, 82, 83, 84, 85, 86, 87, 89, 90, 91; 327/77, 88, 89, 108, 109, 110, 111, 112, 319, 333

[56] References Cited

U.S. PATENT DOCUMENTS 5,280,198  1/1994  Almulla ............................... 307/296.6
5,532,620  7/1996  Seo et al. ................................. 326/81

*Primary Examiner*—Timothy P. Callahan
*Assistant Examiner*—Jeffrey Zweizig
*Attorney, Agent, or Firm*—Thelen Reid & Priest, L.L.P.

[57] ABSTRACT

A semiconductor device for automatically detecting an external interface voltage is disclosed, including a voltage converter for receiving an external interface voltage, and decreasing the external interface voltage value, and a voltage comparator for comparing the voltage outputted from the voltage converter with the internal supply voltage of a semiconductor chip. The semiconductor device automatically detects an external interface voltage environment where the semiconductor chip is used, and also automatically controls the magnitude of output buffer of the semiconductor chip according to the detected external interface voltage value, to prevent the operation speed from being deterioration.

4 Claims, 4 Drawing Sheets

SEMICONDUCTOR DEVICE FOR AUTOMATICALLY DETECTING EXTERNAL INTERFACE VOLTAGE

BACKGROUND OF THE INVENTION

1. Field of the Invention

The present invention relates to a semiconductor device for automatically detecting an external interface voltage, specifically, to a semiconductor device for automatically detecting an external interface voltage, which automatically detects an external interface voltage to control the input and output buffers of a semiconductor chip, developed for a specific voltage, so that the semiconductor chip can be used in an external environment set for the external interface voltage different from the internal supply voltage of the semiconductor chip.

2. Discussion of Related Art

The supply voltage of a semiconductor chip (for example, DRAM), currently being developed, is generally set to 3.3V, and thus the magnitude of transistor of its output buffer is determined on the basis of 3.3V of external voltage. When the DRAM having this characteristic is used for a system together with other chip such as CPU, there is a case where the DRAM's output buffer, designed for 3.3V, should make an interface with an external voltage of 5.0V. At this time, when a connection line (data input/output line) between the chips which use CMOS logic fully swings from 0V to Vcc, the connection line is charged with Vcc in case that a logic "high" is written into the DRAM.

Accordingly, when a logic "low" is read from the DRAM after the writing of logic "high", the output buffer of pull-down transistor must discharge the charges in the connection line, to make the connection line 0V. The amount of charge in the connection line of the DRAM when the Vcc is 5.0V is much larger than that in case of 3.3V of Vcc. Thus, it takes longer time to discharge the 5.0V of data input/output line because the pull-down transistor of DRAM for 3.3V is designed to decrease the potential of the data input/output line charged with 3.3V to 0V for a predetermined period of time. Accordingly, the DRAM operates under a given specification in 3.3V environment, whereas it does not operate normally in the specification of 5.0V environment.

SUMMARY OF THE INVENTION

Accordingly, the present invention is directed to a semiconductor device for automatically detecting an external interface voltage that substantially obviates one or more of the problems due to limitations and disadvantages of the related art.

An object of the present invention is to provide a semiconductor device for automatically detecting an external interface voltage, which automatically detects an external interface voltage to control the input and output buffers of a semiconductor chip, developed for a specific voltage, so that the semiconductor chip can be used in an external environment with the external interface voltage different from the internal supply voltage of the semiconductor chip.

According to the present invention, a device for automatically detecting an external interface voltage is set inside a DRAM, the internal operation voltage of the DRAM and external interface voltage are applied to the device, and the device is constructed in a manner that its output value depends on the external interface voltage, which is 3.3V or 5V. The output value is used for controlling the magnitude of transistor of output buffer of DRAM. By doing so, the DRAM can maintain an uniform operation speed at both environments of 3.3V and 5V.

According to the present invention, the semiconductor device for externally detecting an external interface voltage, which compares the external interface voltage with the internal supply voltage of a semiconductor chip, includes a voltage converter for receiving the external interface voltage, and decreasing the external interface voltage value, and a voltage comparator for comparing the voltage outputted from the voltage converter with the internal supply voltage.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
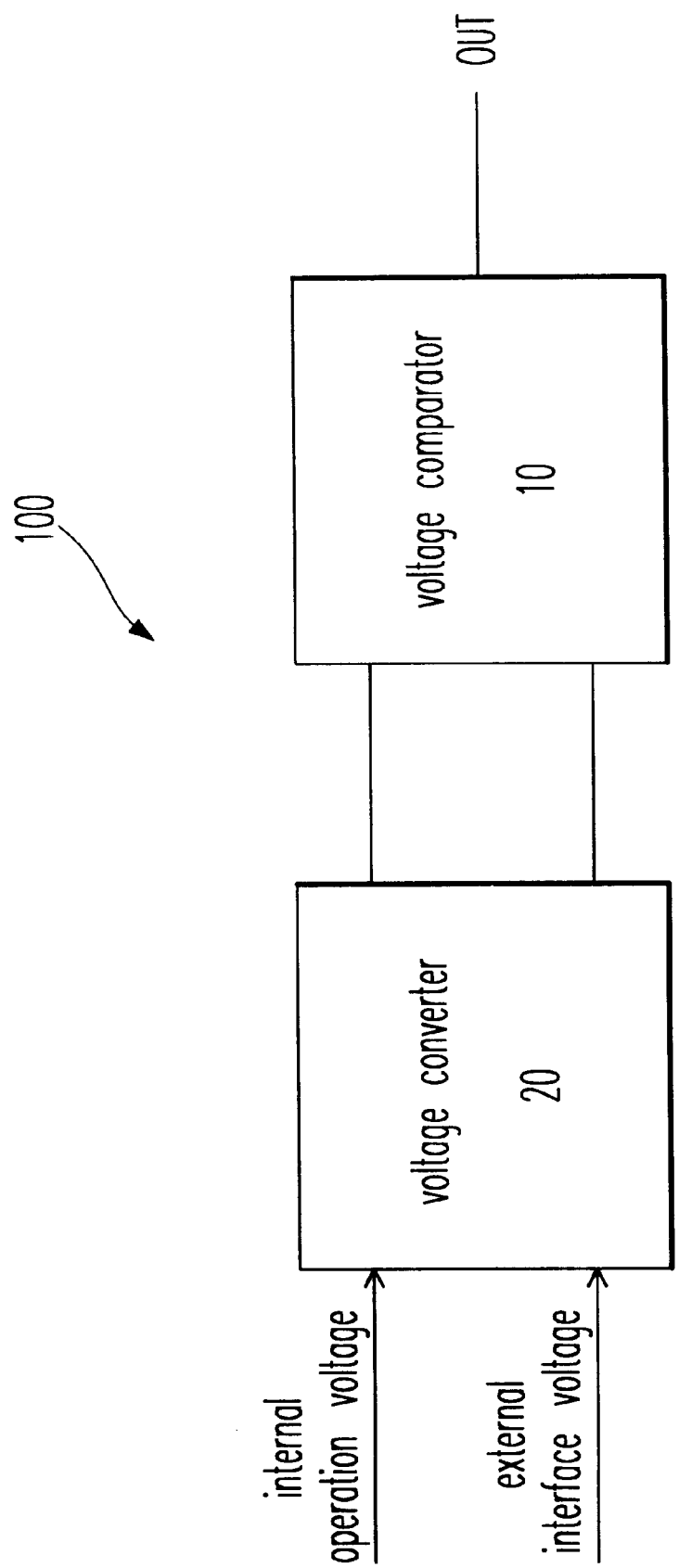
FIG. 1 is a block diagram of a semiconductor device for automatically detecting an external interface voltage according to the present invention.

FIG. 1 is a block diagram of a semiconductor device for automatically detecting an external interface voltage according to the present invention. Referring to FIG. 1, the semiconductor device 100 includes a voltage converter 20 for receiving the internal operation voltage of a semiconductor chip, and an external interface voltage, decreasing or increasing one or both of the two voltages, a voltage comparator 10 for comparing the magnitude of the two voltages outputted from the voltage converter with each other, and an output line OUT for outputting the compared result.

Figure 2:
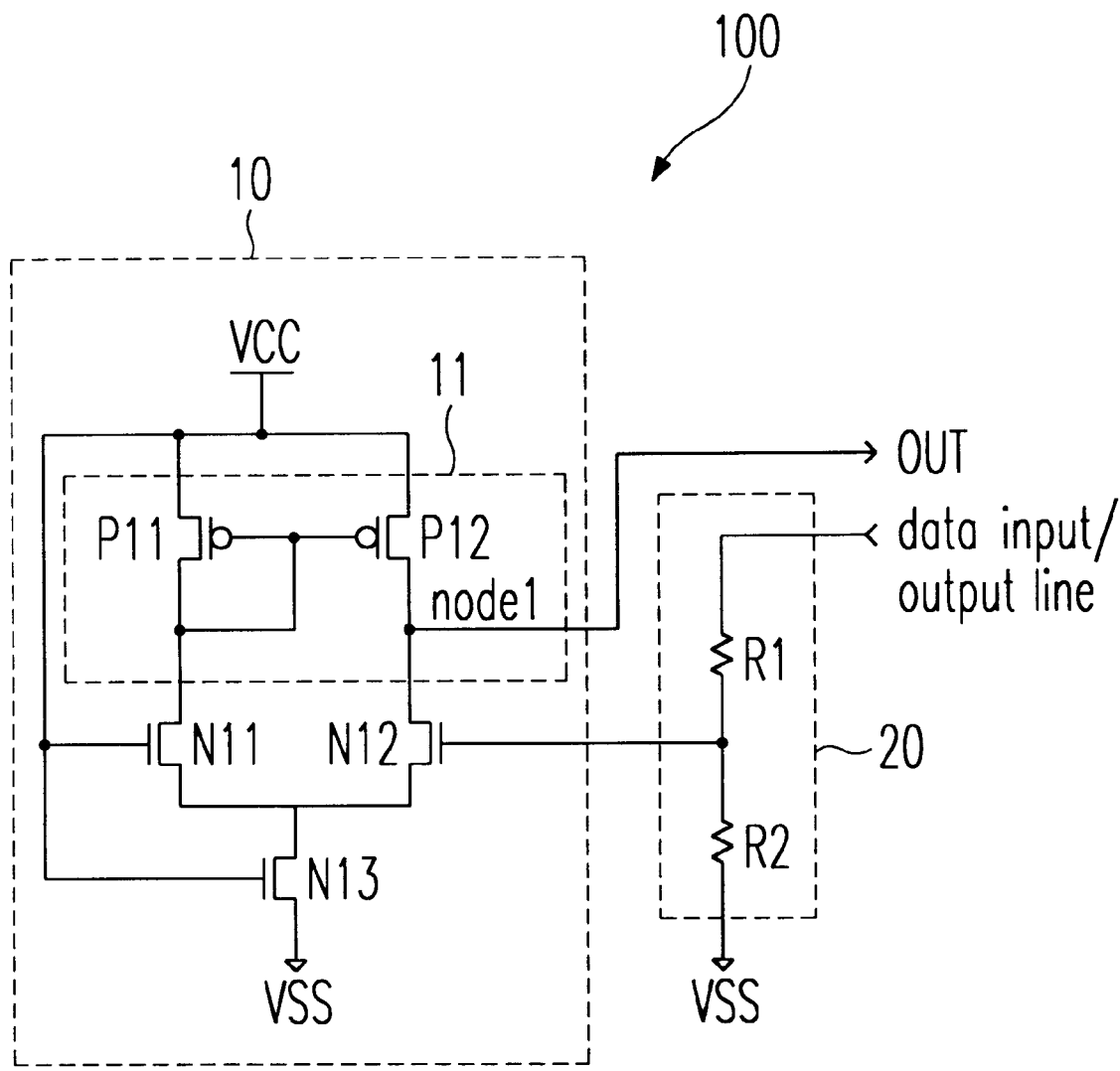
FIG. 2 is a circuit diagram of the semiconductor device for automatically detecting an external interface voltage according to the present invention.

FIG. 2 is a circuit diagram of the semiconductor device for automatically detecting an external interface voltage according to the present invention. Voltage converter 20 is configured of a passive resistance element, and voltage comparator 10 is configured using a current mirror. Referring to FIG. 2, the circuit includes: a current mirror 11 consisting of a plurality of PMOS transistors P11 and P12; an NMOS transistor N11 which is connected to one side of current mirror 11, and receives the internal operation voltage of the DRAM to its gate; an NMOS transistor N12 which is connected to one side of current mirror 11, decreases the voltage of data input/output line of the DRAM by a predetermined level, and receives the decreased voltage to its gate; a plurality of resistors R1 and R2 which are connected to the gate of NMOS transistor N12, and decrease the voltage inputted or outputted through the data input/output line; an output line OUT which outputs a result obtained by comparing the voltages applied to the each of gates of NMOS transistors N11 and N12; and an NMOS transistor N13.

Resistors R1 and R2 are used for decreasing or increasing voltage, and they may be configured of an active element or passive element. In an embodiment of the present invention, the resistors are configured of passive elements. When a plurality of passive elements are used, resistors R1 and R2 decrease the voltage of data input/output line to R2/(R1+R2) . When the external interface voltage is 3.3V which corresponds to the internal operation voltage of DRAM, the external interface voltage is decreased as described above, so as to apply a voltage lower than 3.3V to NMOS transistor N12. Here, it is required that resistors R1 and R2 have very large value in order to prevent current consumption. Furthermore, it is preferable that the value of resistors R1 and R2 is determined to allow the value of 5.0V(external interface voltage)×R2/(R1+R2) to be larger than 3.3V (internal operation voltage of DRAM).

Figure 3:
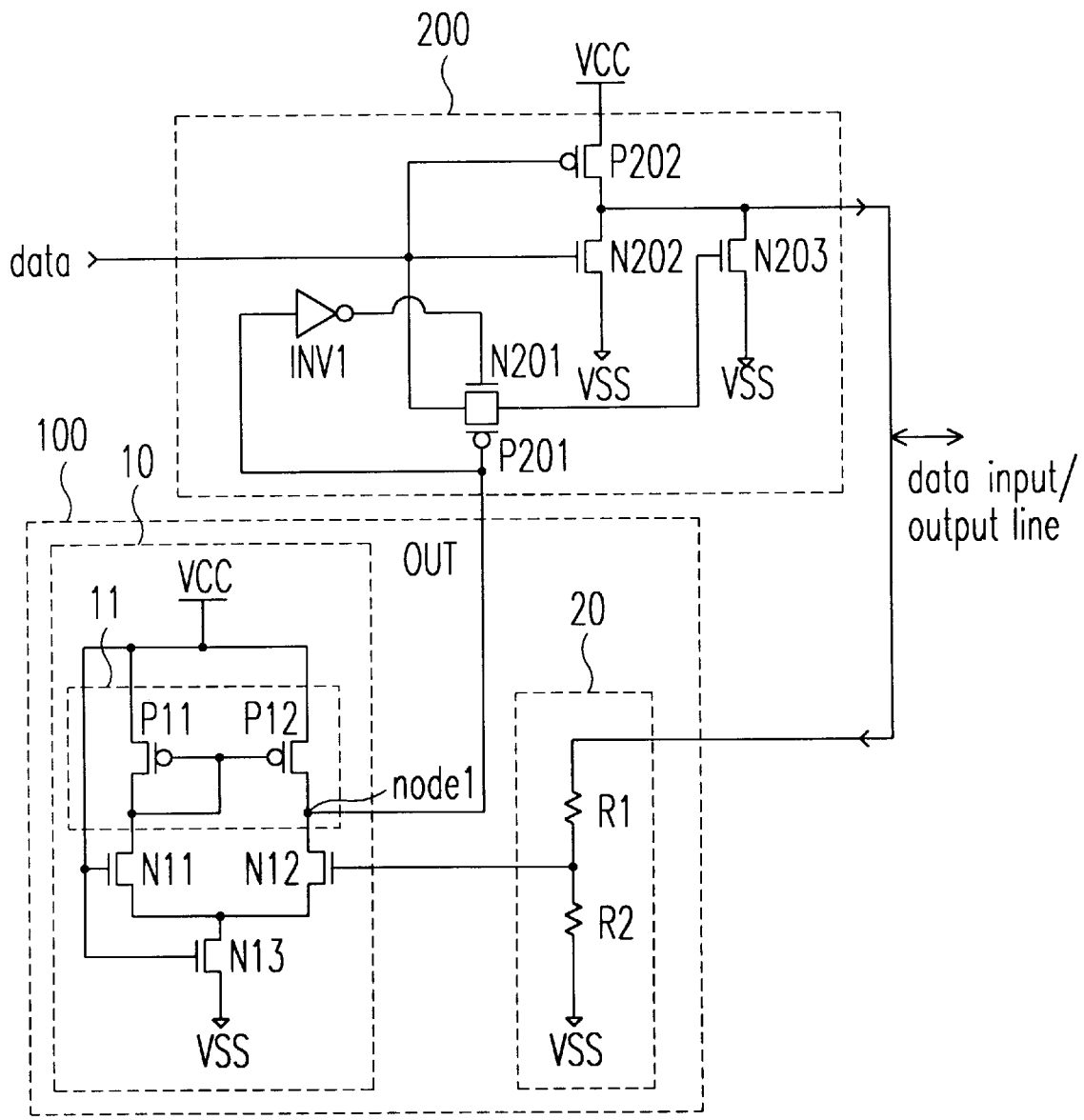
FIG. 3 is a circuit diagram of an embodiment of an external interface voltage auto-detecting section according to the present invention.

FIG. 3 is a circuit diagram showing an example where the semiconductor device for automatically detecting an external interface voltage of the present invention is connected to the data input/output section of a semiconductor chip. Referring to FIG. 3, the device includes an external interface voltage auto-detecting section 100 for detecting an external interface voltage of DRAM, and a data output section 200 controlled by a signal outputted from external interface voltage auto-detecting section 100 to control the magnitude of the data output buffer of the semiconductor chip.

Data output section 200 includes: a transfer transistor N201 and P201 which is turned on/off on the reception of the output of external interface voltage auto-detecting section 100, and output of an inverter INV1 inverting the output of external interface voltage auto-detecting section 100; a pull-down transistor N202 one side of which is connected to a pull-up transistor, and the other side of which is connected to the ground, pull-down transistor P202 being turned on/off according to data of logic "high" and "low" applied through its gate; a pull-up transistor P202 which receives supply voltage Vcc; and a pull-down transistor N203 connected to transfer transistor N201 and P201, so as to be turned on/off according to the operation of the transfer transistor. Here, though pull-up transistor P202 is configured of a PMOS transistor, an NMOS transistor can be also used for the pull-up transistor.

The operation of the semiconductor device for automatically detecting an external interface voltage according to the present invention is explained below.

When the DRAM is used in a specific system environment, first of all, data is written into the DRAM. When data of logic "low" is written into the DRAM, its data input/output line is discharged with 0V whether its external interface voltage is 3.3V or 5.0V. Accordingly, in this case, it is impossible to discriminate whether the external interface voltage is 3.3V or 5.0V. However, since the data input/output line is discharged with 0V, there is no problem to read the "low" data from the DRAM.

On the contrary, when data of logic "high" is written into the DRAM, its data input/output line is charged with 3.3V or 5.0V according to the external interface voltage. Thus, it is possible to discriminate if the external interface voltage is 3.3V or 5.0V. The operation of the circuit in this case is explained below. When data of logic "high" is applied to the data input/output line to be written into the DRAM, the external interface voltage×R2/(R1+R2) is applied to the gate of NMOS transistor N12, and this voltage and the internal operation voltage of DRAM, which is applied to NMOS transistor N11, are compared with each other. The compared result is outputted through a node 1 to an external line. When the external interface voltage is larger than the operation voltage of DRAM, the value of logic "low" is outputted. When the external interface voltage is smaller than the operation voltage, the value of logic "high" is outputted.

Data output section 200 controls the pull-down transistor of output buffer according to the output of external interface auto-detecting section 100. When this output value is a logic "high", transfer transistor N201 and P201 is turned off, and thus, pull-down transistor N203 is also turned off. When pull-down transistor N203 is turned off, only pull-down transistor N202 of data output section 200 is operated.

When the output of external interface voltage auto-detecting section 100 is a logic "low", transfer transistor N201 and P201 is turned on, and thus, pull-down transistor N203 is also turned on, increasing the magnitude of the pull-down transistor of data output buffer. Accordingly, the charges in the data input/output line is rapidly discharged even if the external interface voltage is 5.5V.

Figure 4:
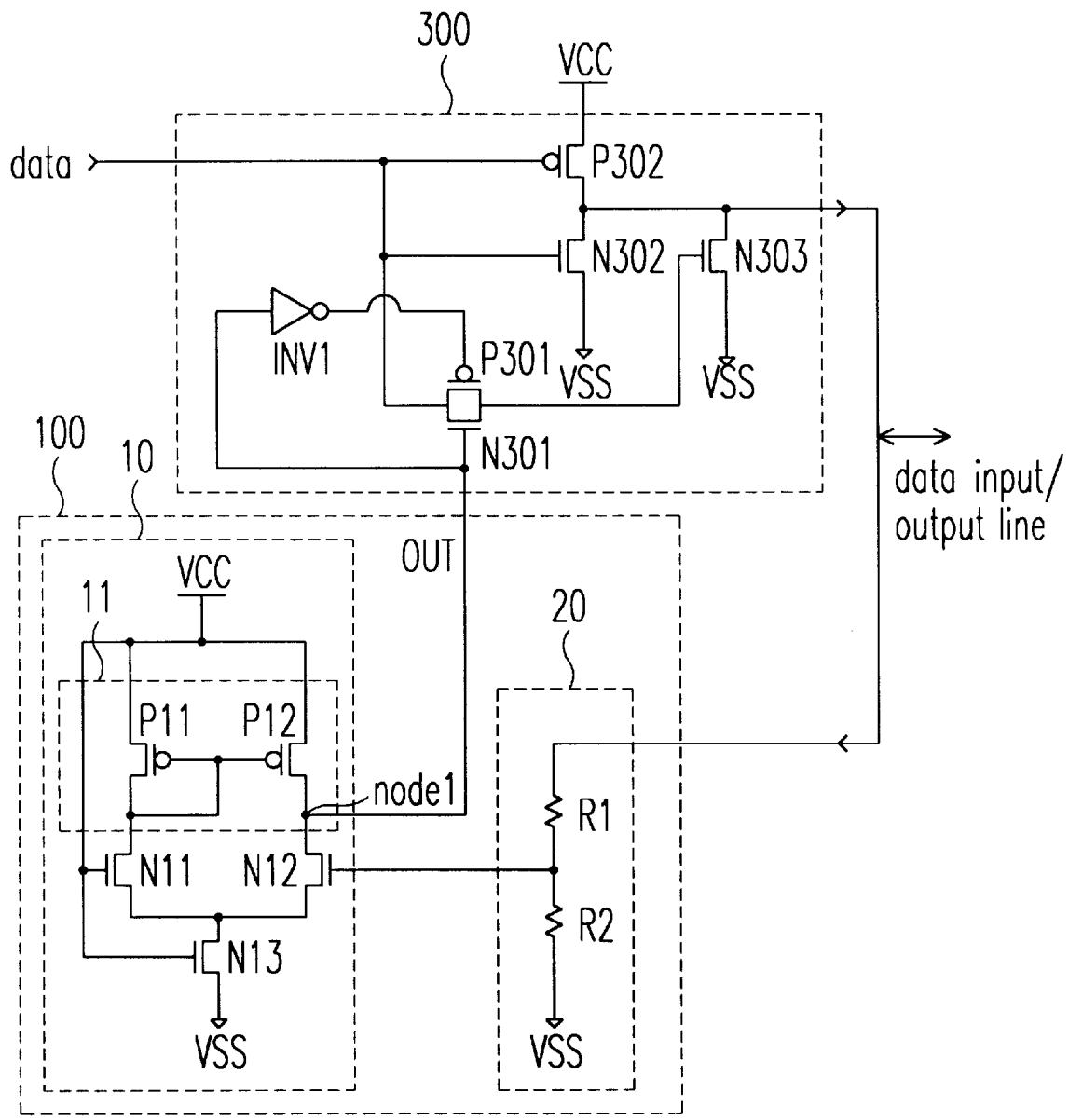
FIG. 4 is a circuit diagram of another embodiment of the external interface voltage auto-detecting section according to the present invention.

FIG. 4 is a circuit diagram of another embodiment of the semiconductor device for automatically detecting an external interface voltage of the present invention. The input buffer of a semiconductor device, generally, determines the logic threshold value according to the level of an input signal. For example, the logic threshold value is 1.6V at 'TTL' level (5.0V), and 1.4V at 'LVTTL' level (3.3V). The logic threshold value depends on the magnitude of pull-up and pull-down transistors. The logic threshold value of the input buffer can be controlled using the semiconductor device for automatically detecting an external interface voltage of the present invention.

Since the operation of external interface voltage auto-detecting section 100 is the same as that in the case of FIG. 3, the explanation for this is omitted. The operation of data input section 300 is similar to that of data output section 200 of FIG. 3, other than the polarity of voltage which is applied to the gate of transfer transistor N201 and P201. Thus, the explanation for the data input section is also omitted. Therefore, when the output value of external interface voltage auto-detecting section 100 is logic "high", pull-down transistor N303 operates, to thereby decrease the logic threshold value of the input buffer.

As described above, the present invention automatically detects an external interface voltage environment where the DRAM is used, and also automatically controls the magnitude of transistor of output buffer according to the detected external interface voltage value, to prevent the operation speed from deterioration, in contrast to the conventional DRAM which cannot control the magnitude of pull-up or pull-down transistor of the output device according to the variation of external interface voltage so that the read operation of data "low" becomes slower when the DRAM is used in an environment of external interface voltage higher than the operation voltage of DRAM, to decrease the operation speed of DRAM.

It will be apparent to those skilled in the art that various modifications and variations can be made in the semiconductor device for automatically detecting an external interface voltage of the present invention without departing from the spirit or scope of the invention. Thus, it is intended that the present invention cover the modifications and variations of this invention provided they come within the scope of the appended claims and their equivalents.

What is claimed is:

1. A semiconductor device for detecting an external interface voltage, which compares the external interface voltage with an internal supply voltage of a semiconductor chip, and outputs a compared result through an output line, the semiconductor device comprising:

a voltage converter for receiving the external interface voltage, and decreasing the external interface voltage;

a voltage comparator for comparing the voltage output from the voltage converter with the internal supply voltage; and a data output section that includes pull-down transistors having a conduction magnitude that is controlled by a signal output from the voltage comparator.

2. The semiconductor device as claimed in claim 1, wherein:

the voltage converter receives the external interface voltage from a data input/output line and decreases the external voltage according to a resistance ratio of a plurality of resistance elements.

3. The semiconductor device as claimed in claim 1, wherein the voltage comparator includes:

a current mirror including a plurality of MOS transistors;

a first MOS transistor which is connected to one side of the current mirror, and receives the internal supply voltage of the semiconductor chip to its gate;

a second MOS transistor which is connected to another side of the current mirror, and receives the decreased external interface voltage from the voltage converter to its gate;

a third MOS transistor commonly connected to the first and second MOS transistors; and wherein the output line outputs the result by comparing the voltages which are respectively applied to the gates of the first and second MOS transistors.

4. The semiconductor device as claimed in claim 1, wherein the data output section includes:

a transfer gate which is turned on or off on the reception of the output of the voltage comparator and an output of an inverter inverting the output of the voltage comparator;

a first pull-down transistor from among the pull-down transistors, one side of which is connected to a pull-up transistor, and the other side of which is connected to ground, the first pull-down transistor being turned on or off according to data of logic "high" or "low" which is applied through its gate;

the pull-up transistor for receiving the supply voltage; and a second pull-down transistor from among the pull-down transistors, which is connected to the transfer gate, and which is turned on or off according to the operation of the transfer gate.

* * * * *